(12) United States Patent
Koike

(10) Patent No.: US 8,084,798 B2
(45) Date of Patent: Dec. 27, 2011

(54) SEMICONDUCTOR DEVICE HAVING IMAGE SENSOR

(75) Inventor: Hidetoshi Koike, Yokomama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 12/119,689

(22) Filed: May 13, 2008

(65) Prior Publication Data

US 2008/0283948 A1 Nov. 20, 2008

(30) Foreign Application Priority Data

May 15, 2007 (JP) ................................ 2007-129577

(51) Int. Cl.
*H01L 31/12* (2006.01)
(52) U.S. Cl. ............... 257/294; 257/435; 257/E27.113; 257/E31.122; 438/69
(58) Field of Classification Search .................... None
See application file for complete search history.

(56) References Cited

U.S. PATENT DOCUMENTS

| 6,376,872 | B1 | 4/2002 | Pai et al. | |
|---|---|---|---|---|
| 6,891,207 | B2 | 5/2005 | Pequignot et al. | |
| 2002/0024001 | A1 * | 2/2002 | Hiyama et al. | 250/208.1 |
| 2002/0051071 | A1 * | 5/2002 | Itano et al. | 348/340 |
| 2005/0208692 | A1 * | 9/2005 | Lee | 438/29 |
| 2006/0118698 | A1 * | 6/2006 | Yu | 250/208.1 |
| 2006/0292734 | A1 * | 12/2006 | Kim | 438/70 |
| 2008/0111159 | A1 * | 5/2008 | Gambino et al. | 257/225 |

FOREIGN PATENT DOCUMENTS

JP 2002-76322 3/2002

OTHER PUBLICATIONS

U.S. Appl. No. 12/971,478 filed Dec. 17, 2010.

* cited by examiner

*Primary Examiner* — Wael Fahmy
*Assistant Examiner* — Abul Kalam
(74) *Attorney, Agent, or Firm* — Oblon, Spivak, McClelland, Maier & Neustadt, L.L.P.

(57) ABSTRACT

A pixel area for generating an image signal corresponding to incident light is formed on a semiconductor substrate. A light-shielding layer is formed on the semiconductor substrate around the pixel area. The light-shielding layer has a slit near the pixel area and shields the incident light. A passivation film is formed in the pixel area, on the light-shielding layer, and in the slit. A coating layer is formed in the slit of the light-shielding layer and on the passivation film in the pixel area. Microlenses are formed on the coating layer in the pixel area.

10 Claims, 3 Drawing Sheets

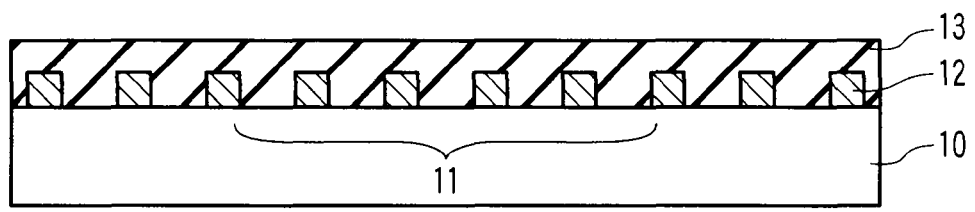
F I G. 3
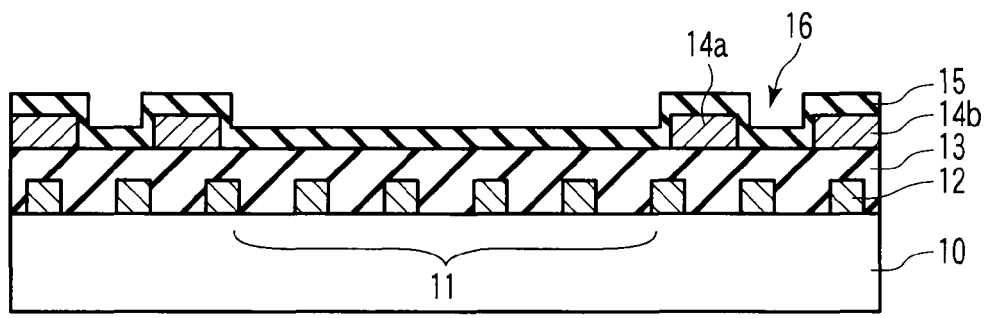
F I G. 4
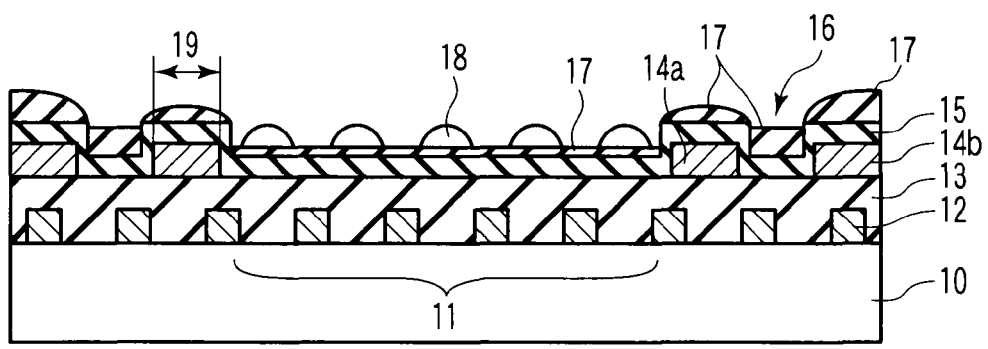
F I G. 5

SEMICONDUCTOR DEVICE HAVING IMAGE SENSOR

CROSS-REFERENCE TO RELATED APPLICATIONS

This application is based upon and claims the benefit of priority from prior Japanese Patent Application No. 2007-129577, filed May 15, 2007, the entire contents of which are incorporated herein by reference.

BACKGROUND OF THE INVENTION

1. Field of the Invention

The present invention relates to a semiconductor device having an image sensor and, for example, to an image sensor having a light-shielding layer formed from the uppermost metal interconnection layer.

2. Description of the Related Art

In an image sensor, a coating layer is formed under microlenses. This aims at increasing the adhesion between the microlenses and the passivation film of the uppermost layer. A light-shielding layer consisting of the uppermost metal interconnection layer of a metal interconnection multilayer is formed around the pixel area to detect the dark signal level of each pixel.

An image sensor manufacturing method will briefly be described below. An intra-pixel interconnection layer is formed on a semiconductor substrate which has a pixel area with photodiodes. An interlayer dielectric film is formed on the semiconductor substrate with the intra-pixel interconnection layer. Next, the interlayer dielectric film is polished and planarized by, e.g., CMP. A light-shielding layer consisting of the uppermost metal interconnection layer is formed on the semiconductor substrate around the pixel area. A passivation film is formed on the semiconductor substrate having the light-shielding layer. A coating layer is applied to the passivation film. Microlenses are formed on the coating layer in correspondence with pixels arranged in the pixel area.

In a thus manufactured image sensor, however, since the light-shielding layer is continuously formed around the pixel area, the coating layer on the light-shielding layer near the pixel area flows into the pixel area. For this reason, the coating layer in the pixel area thickens at a part close to the light-shielding layer. This phenomenon is called striation. When microlenses are formed in the region with striation, they have uneven heights. This causes color inconsistency in an image generated by the pixels in the pixel area near the light-shielding layer, resulting in a fatal defect for the image sensor.

As a conventional technique related to the present invention, a solid-state image sensing device has been proposed, which thins the interconnection layer and the light-shielding film formed around the effective pixel area, thereby increasing the flatness of the interlayer film and preventing color misregistration (e.g., Jpn. Pat. Appln. KOKAI Publication No. 2002-76322).

BRIEF SUMMARY OF THE INVENTION

According to a first aspect of the present invention, there is provided a semiconductor device comprising: a pixel area which is formed on a semiconductor substrate, the pixel area generating an image signal corresponding to incident light; a light-shielding layer which is formed on the semiconductor substrate around the pixel area, the light-shielding layer having a slit near the pixel area and shielding the incident light; a passivation film which is formed in the pixel area, on the light-shielding layer, and in the slit; a coating layer which is formed in the slit of the light-shielding layer and on the passivation film in the pixel area; and microlenses which are formed on the coating layer in the pixel area.

According to a second aspect of the present invention, there is provided a semiconductor device comprising: a pixel area which is formed on a semiconductor substrate, the pixel area generating an image signal corresponding to incident light; a first light-shielding layer which is formed on the semiconductor substrate to surround the pixel area, the first light-shielding layer shielding the incident light; a second light-shielding layer which is spaced apart from the first light-shielding layer and formed on the semiconductor substrate to surround the first light-shielding layer, the second light-shielding layer shielding the incident light; a passivation film which is formed in the pixel area, on the first light-shielding layer, on the second light-shielding layer, and between the first light-shielding layer and the second light-shielding layer; a coating layer which is formed on the passivation film between the first light-shielding layer and the second light-shielding layer and on the passivation film in the pixel area; and microlenses which are formed on the coating layer in the pixel area.

According to a third aspect of the present invention, there is provided a semiconductor device manufacturing method comprising: forming, on a semiconductor substrate, a pixel area which generates an image signal corresponding to incident light; forming a light-shielding layer on the semiconductor substrate around the pixel area, the light-shielding layer having a slit near the pixel area and shielding the incident light; forming a passivation film in the pixel area, on the light-shielding layer, and in the slit; forming a coating layer in the slit of the light-shielding layer and on the passivation film in the pixel area; and forming microlenses on the coating layer in the pixel area.

BRIEF DESCRIPTION OF THE SEVERAL VIEWS OF THE DRAWING

FIG. 3 is a sectional view showing the first step in manufacturing the image sensor according to the embodiment;

FIG. 4 is a sectional view showing the second step in manufacturing the image sensor according to the embodiment;

FIG. 5 is a sectional view showing the third step in manufacturing the image sensor according to the embodiment;

DETAILED DESCRIPTION OF THE INVENTION

Figure 1:
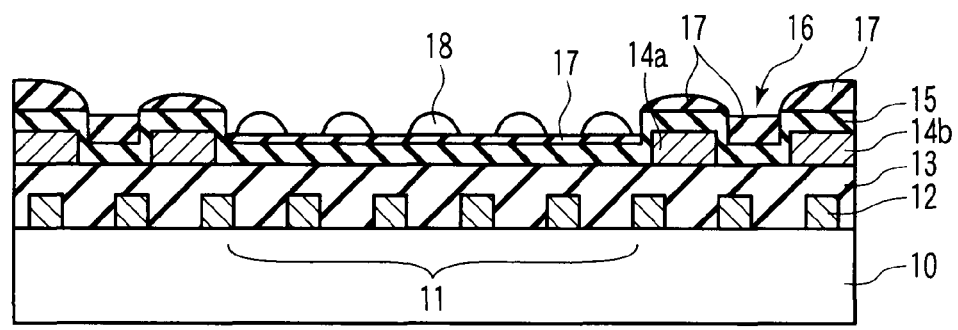
FIG. 1 is a sectional view showing the structure of an image sensor according to an embodiment of the present invention.

A semiconductor device having an image sensor according to an embodiment of the present invention will now be described with reference to the accompanying drawing. In the following description, the same reference numerals denote the same parts throughout the drawing.

Figure 2:
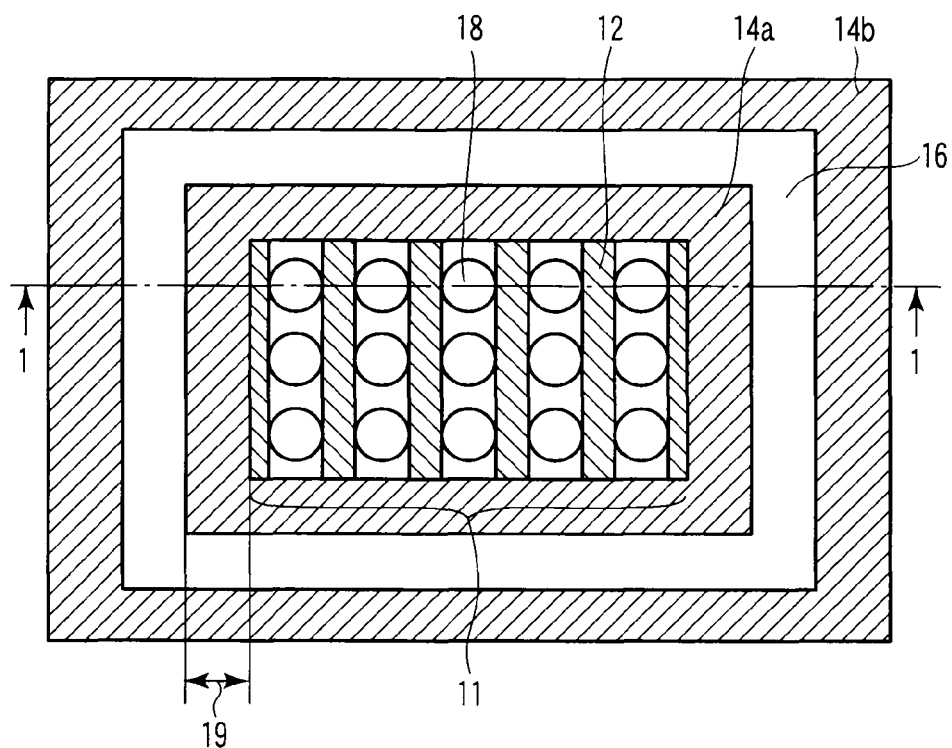
FIG. 2 is a plan view of the image sensor according to the embodiment.

FIG. 1 is a sectional view showing the structure of an image sensor according to an embodiment of the present invention. FIG. 2 is a plan view of the image sensor according to the embodiment. FIG. 1 shows a section taken along a line 1-1 in FIG. 2.

A pixel area 11 having photodiodes is formed on a semiconductor substrate 10. A plurality of pixels are arrayed in the pixel area 11. The pixel area 11 generates an image signal corresponding to incident light. An intra-pixel interconnection layer 12 is formed on the semiconductor substrate 10. An interlayer dielectric film 13 is formed on the semiconductor substrate 10 having the intra-pixel interconnection layer 12. Light-shielding layers 14a and 14b made of the uppermost metal interconnection layer of a metal interconnection multilayer are formed on the interlayer dielectric film 13. The uppermost metal interconnection layers (light-shielding layers) 14a and 14b surround the pixel area 11. A light-shielding layer slit 16 is formed in a region of the light-shielding layers 14a and 14b near the pixel area 11 so as to surround the pixel area 11. In other words, the light-shielding layer 14a is formed to surround the pixel area 11. The light-shielding layer 14b is formed at a position spaced apart from the light-shielding layer 14a to surround it. A passivation film 15 is formed on the interlayer dielectric film 13 having the light-shielding layers 14a and 14b and the light-shielding layer slit 16. A coating layer 17 is formed on the passivation film 15. The coating layer 17 in the pixel area 11 has a uniform thickness. Microlenses 18 are formed on the coating layer 17 in the pixel area 11 in correspondence with the pixels arrayed in the pixel area 11. FIG. 2 does not illustrate the coating layer 17.

A method of manufacturing the image sensor according to the embodiment of the present invention will be described next.

FIGS. 3 to 5 are sectional views showing the steps in manufacturing the image sensor according to the embodiment.

First, as shown in FIG. 3, the intra-pixel interconnection layer 12 is formed on the semiconductor substrate 10 having the pixel area 11 with photodiodes. The intra-pixel interconnection layer 12 is made of a metal such as Al. The interlayer dielectric film 13 is formed on the semiconductor substrate 10 having the intra-pixel Interconnection layer 12. The interlayer dielectric film 13 is made of, e.g., a silicon oxide film. Next, the interlayer dielectric film 13 is polished and planarized by CMP or the like.

Next, as shown in FIG. 4, the light-shielding layers 14a and 14b made of the uppermost metal interconnection layer are formed on the interlayer dielectric film 13 around the pixel area 11. The light-shielding layers 14a and 14b surround the pixel area 11. The light-shielding layer slit 16 is formed between the light-shielding layers 14a and 14b near the pixel area 11. The light-shielding layers 14a and 14b are made of a metal such as Al. The passivation film 15 is formed on the interlayer dielectric film 13 having the light-shielding layers 14a and 14b. The passivation film 15 is made of, e.g., a silicon nitride film.

Next, as shown in FIG. 5, the coating layer 17 having fluidity is applied to the passivation film 15. The microlenses 18 are formed on the coating layer 17 in the pixel area 11 in correspondence with the pixels arrayed in the pixel area 11. The coating layer 17 is made of, e.g., acrylic resin and is formed to increase the adhesion between the passivation film 15 and the microlenses 18. The microlenses 18 are made of, e.g., acrylic resin.

In the image sensor having the above-described structure, the light-shielding layer slit 16 is formed between the light-shielding layers 14a and 14b close to the pixel area 11, as shown in FIG. 1. With this structure, the coating layer 17 applied to the light-shielding layers 14a and 14b near the pixel area 11 divisionally flows into the light-shielding layer slit 16 and the pixel area 11. The amount of the coating layer 17 flowing into the pixel area 11 decreases to half. This suppresses the phenomenon (striation) wherein the coating layer 17 thickens unevenly in the pixel area 11. Especially, the phenomenon wherein the coating layer thickens in the pixel area near the light-shielding layer can be suppressed. As a result, the microlenses 18 formed on the coating layer 17 obtain a uniform height. It is therefore possible to prevent color inconsistency in an image generated in the pixel area 11 near the light-shielding layer.

An effect obtained by forming the light-shielding layer slit 16 between the light-shielding layers 14a and 14b in the image sensor of the embodiment will be described below.

Figure 6:
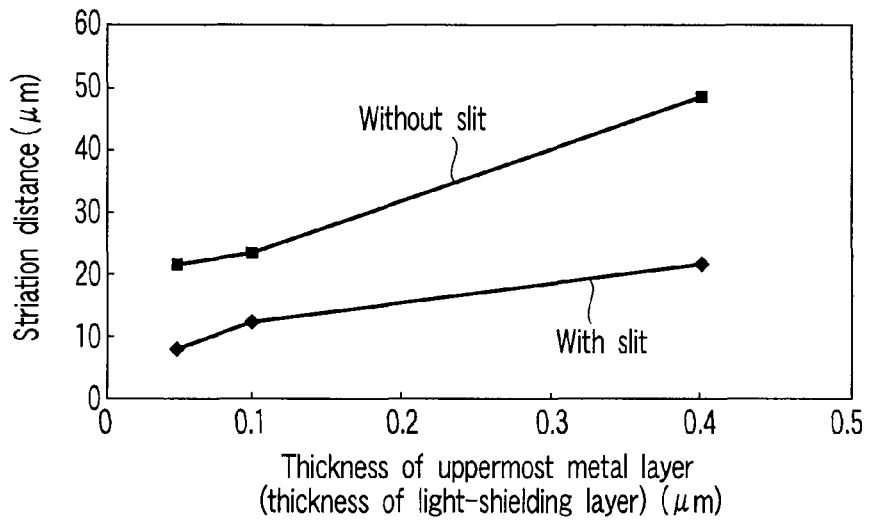
FIG. 6 is a graph showing an effect obtained by forming a light-shielding layer slit in the image sensor according to the embodiment.

FIG. 6 is a graph showing the relationship between the thickness of the light-shielding layer and the distance at which striation occurs in a structure having the light-shielding layer slit 16 between the light-shielding layers 14a and 14b and a structure without the light-shielding layer slit 16. In this example, a width (the distance between an end of the pixel area 11 and an end of the light-shielding layer slit 16) 19 of the light-shielding layer having one end contacting the pixel area 11 and the other end contacting the light-shielding layer slit 16 is 7.1 µm.

As is apparent from FIG. 6, when the light-shielding layer slit 16 is formed between the light-shielding layers 14a and 14b, the distance at which striation occurs decreases to almost half or less as compared with the structure without the light-shielding layer slit 16. Hence, in the image sensor according to the embodiment, it is possible to suppress the phenomenon (striation) wherein the coating layer 17 having an uneven thickness is formed in the pixel area 11. The striation suppression effect is particularly large when the thickness of the light-shielding layer is 0.4 µm or more. Note that the width 19 of the light-shielding layer is preferably greater than its thickness but no greater than 7.1 µm.

As described above, in this embodiment, the light-shielding layer slit 16 is formed between the light-shielding layers 14a and 14b near the pixel area 11. For this reason, the coating layer 17 on the light-shielding layers 14a and 14b in contact with the pixel area 11 divisionally flows into the light-shielding layer slit 16 and the pixel area 11. The amount of the coating layer 17 flowing into the pixel area 11 decreases, and the phenomenon (striation) wherein the coating layer 17 thickens unevenly in the pixel area 11 is suppressed. Hence, the heights of the microlenses 18 formed on the coating layer 17 in the pixel area 11 become uniform, and no color inconsistency occurs in an image generated in the pixel area 11.

When the light-shielding layer slit 16 is formed between the light-shielding layers 14a and 14b near the pixel area 11 so as to surround the pixel area 11, the coating layer 17 on the light-shielding layers 14a and 14b in the overall peripheral region contacting the pixel area 11 divisionally flows into the pixel area 11 and the light-shielding layer slit 16 that surrounds the pixel area 11. The amount of the coating layer 17 flowing into the pixel area 11 decreases in the overall region around the pixel area 11, and the phenomenon (striation) wherein the coating layer 17 thickens unevenly in the pixel area 11 is suppressed. Hence, the heights of the microlenses 18 formed on the coating layer 17 in the pixel area 11 become uniform, and no color inconsistency occurs in an image generated in the pixel area 11.

Figure 7:
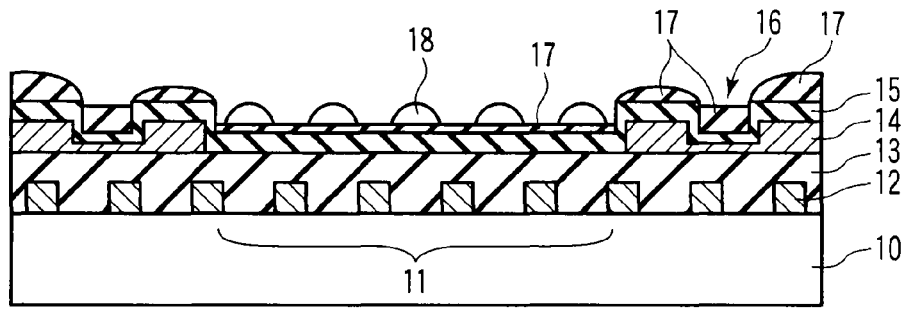
FIG. 7 is a sectional view showing the structure of an image sensor according to the first example of the embodiment of the present invention.
Figure 8:
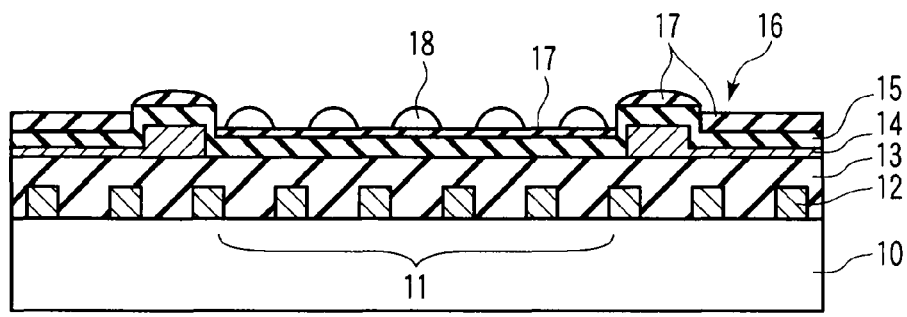
FIG. 8 is a sectional view showing the structure of an image sensor according to the second example of the embodiment of the present invention.

Other examples of the embodiment will be described below. In the image sensor shown in FIG. 1, the light-shielding layer is separated into the light-shielding layers 14*a* and 14*b*. As another example, instead of separating the light-shielding layer into the light-shielding layers 14*a* and 14*b*, a trench may be formed on a light-shielding layer 14, as shown in FIGS. 7 and 8. The remaining structures and effects are the same as in the image sensor shown in FIG. 1.

According to the embodiment of the present invention, it is possible to suppress the phenomenon wherein the coating layer thickens unevenly in the pixel area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a pixel area which is formed on a semiconductor substrate, the pixel area including pixels, and each of the pixels generating an image signal corresponding to incident light;
   a light-shielding layer which is formed on the semiconductor substrate around the pixel area, the light-shielding layer having a slit near the pixel area and shielding the incident light;
   a passivation film which is formed in the pixel area, on the light-shielding layer, and in the slit, the passivation film in the pixel area having a planar surface all over the pixels and between the pixels;
   a coating layer which is formed in the slit of the light-shielding layer and on the passivation film in the pixel area, the coating layer in the pixel area has a uniform thickness all over the pixels and between the pixels; and
   microlenses which are formed on the coating layer in the pixel area, the microlenses being arranged with respect to the pixels, respectively.

2. The device according to claim 1, further comprising:
   an interconnection layer which is formed on the semiconductor substrate having the pixel area; and
   an interlayer dielectric film which is formed on the semiconductor substrate to cover the interconnection layer,
   wherein the light-shielding layer is arranged on the interlayer dielectric film.

3. The device according to claim 1, wherein the slit of the light-shielding layer is formed to surround the pixel area.

4. The device according to claim 1, wherein the light-shielding layer is formed using an uppermost metal interconnection layer of a metal interconnection multilayer.

5. The device according to claim 4, wherein the uppermost metal interconnection layer is not formed in the pixel area.

6. The device according to claim 1, wherein the coating layer is formed from acrylic resin having fluidity.

7. A method of manufacturing a semiconductor device, comprising:
   forming, on a semiconductor substrate, a pixel area including pixels, each of the pixels generating an image signal corresponding to incident light;
   forming a light-shielding layer on the semiconductor substrate around the pixel area, the light-shielding layer having a slit near the pixel area and shielding the incident light;
   forming a passivation film in the pixel area, on the light-shielding layer, and in the slit, the passivation film in the pixel area having a planar surface all over the pixels and between the pixels;
   forming a coating layer in the slit of the light-shielding layer and on the passivation film in the pixel area, the coating layer in the pixel area having a uniform thickness all over the pixels and between the pixels; and
   forming microlenses on the coating layer in the pixel area such that the microlenses are arranged with respect to the pixels, respectively.

8. The method according to claim 7, further comprising:
   forming an interconnection layer on the semiconductor substrate having the pixel area; and
   forming an interlayer dielectric film on the semiconductor substrate to cover the interconnection layer,
   wherein the light-shielding layer is arranged on the interlayer dielectric film.

9. The method according to claim 7, wherein the slit of the light-shielding layer is formed to surround the pixel area.

10. The method according to claim 7, comprising:
    forming the light shielding layer from an uppermost metal interconnection layer of a metal interconnection multilayer which is not formed in the pixel area.

* * * * *